United States Patent
Wiesler et al.

(10) Patent No.: US 7,153,083 B2
(45) Date of Patent: *Dec. 26, 2006

(54) MATERIAL HANDLING AND TRANSPORT PROCESS

(75) Inventors: Mord Wiesler, Lexington, MA (US); Mitchell Weiss, Carlisle, MA (US); Gerald M. Friedman, New Ipswich, NH (US)

(73) Assignee: Brooks Automation, Inc., Chelmsford, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 10/228,625

(22) Filed: Aug. 26, 2002

(65) Prior Publication Data

US 2003/0007849 A1    Jan. 9, 2003

(51) Int. Cl.
B65G 49/07    (2006.01)
(52) U.S. Cl. .................. 414/590; 414/806; 414/940
(58) Field of Classification Search ............. 414/217, 414/217.1, 222.13, 226.05, 282, 283, 539, 414/541, 589, 590, 609, 672, 805, 806, 812, 414/940; 104/138.1, 139
See application file for complete search history.

(56) References Cited

U.S. PATENT DOCUMENTS

| | | | |
|---|---|---|---|
| 4,649,830 A | 3/1987 | Tanaka | 104/138.1 |
| 4,682,927 A | 7/1987 | Southworth et al. | 414/217 |
| 4,904,153 A | 2/1990 | Iwasawa et al. | 414/735 |
| 5,064,331 A | 11/1991 | Yamaguchi et al. | 414/609 |
| 5,098,244 A | 3/1992 | Stimson | 414/590 |
| 5,116,182 A | 5/1992 | Lin | 414/282 |
| 5,372,241 A | 12/1994 | Matsumoto | 198/465.4 |
| 5,399,531 A | 3/1995 | Wu | 437/205 |
| 5,454,328 A | 10/1995 | Matsuzaki et al. | 104/139 |
| 5,957,648 A | 9/1999 | Bachrach | 414/217 |
| 5,964,561 A | 10/1999 | Marohl | 414/217 |
| 5,980,183 A | 11/1999 | Fosnight | 414/222.01 |
| 6,169,935 B1 | 1/2001 | Iwasaki et al. | 700/214 |
| 6,235,634 B1 | 5/2001 | White et al. | 438/680 |
| 6,354,781 B1 | 3/2002 | Pan | 414/217 |
| 6,679,671 B1 * | 1/2004 | Blonigan et al. | 414/217 |
| 6,712,577 B1 * | 3/2004 | Davis et al. | 414/217 |

FOREIGN PATENT DOCUMENTS

| | | | |
|---|---|---|---|
| GB | 2376938 | * 12/2002 | |
| JP | 3-248433 A | 11/1991 | |
| JP | 5-17006 | 1/1993 | 414/283 |

* cited by examiner

*Primary Examiner*—James Keenan
(74) *Attorney, Agent, or Firm*—Weingarten, Schurgin, Gagnebin & Lebovici LLP

(57) ABSTRACT

A material handling and transport system and process for moving a substrate carrier between storage and processing destinations are provided. The system includes a vehicle that runs on a support structure, such as a pathway or a track assembly supported on the floor, which may be in a pressurized tunnel. A carrier nest on the vehicle receives and supports the carrier. A lifting mechanism on the vehicle vertically raises and lowers the carrier nest. A load port support surface is disposed vertically above the support structure. The carrier is raised through an opening in the load port support surface. A load port nest on the load port support surface receives and supports the carrier adjacent a selected destination. A carrier manipulation mechanism manipulates the carrier over the load port nest. The lifting mechanism then lowers the carrier onto the load port nest. The system is particularly suited for handling and transporting semiconductor wafer carriers.

10 Claims, 6 Drawing Sheets

MATERIAL HANDLING AND TRANSPORT PROCESS

CROSS REFERENCE TO RELATED APPLICATIONS

This application claims priority to prior U.S. application Ser. No. 09/517,033, filed Mar. 2, 2000, now U.S. Pat. No. 6,443,686, the disclosure of which is incorporated by reference herein.

STATEMENT REGARDING FEDERALLY SPONSORED RESEARCH OR DEVELOPMENT

N/A

BACKGROUND OF THE INVENTION

Presently in semiconductor manufacturing facilities, semiconductor wafers are transported between various destinations, such as storage locations and processing stations, in closed containers. These containers are delivered to load ports at the desired storage location or processing station either manually or by an overhead hoist system. Once the containers have been delivered to the load port, a door on the container is removed before the wafers can be accessed.

Overhead hoist systems are advantageous in that they can be positioned out of the way of the processing stations and storage locations. Also, they do not block access to the facilities by personnel.

A semiconductor wafer carrier has on its bottom surface a kinematic coupling that interfaces with kinematic coupling pins specified by the SEMI E57 standard.

SUMMARY OF THE INVENTION

The present invention relates to a floor-supported material handling and transport system for moving material supported by a carrier between storage and processing destinations. The system comprises one or more vehicles that run along a support structure, for example, a pathway or a track assembly supported on a floor. The system may be located in a tunnel. The tunnel may be pressurized above the ambient environment to prevent particles and other contaminants from entering the tunnel if it is desired to maintain a clean environment in the tunnel.

The vehicle comprises one or more trucks configured to run along the support structure and a chassis supported by the trucks. The vehicle also comprises a carrier nest configured to receive and support a carrier capable of holding a material to be transported along the support structure. The carrier nest includes a plurality of pins configured to mate with corresponding recesses on a bottom surface of the carrier. The carrier nest may be configured to maintain the carrier at a incline, such as 5° from horizontal, to prevent material in the carrier from falling out of an opening in the carrier during transport and handling. A lifting mechanism is operative to vertically raise and lower the carrier nest.

A load port support surface, which may be the top surface of the tunnel, is disposed vertically above the support structure. An opening is provided in the load port support surface sized to allow vertical passage of the carrier therethrough. A load port nest on the load port support surface is configured to receive and support the carrier adjacent a selected destination. The load port nest includes a plurality of pins configured to mate with corresponding recesses on the bottom surface of the carrier. A carrier manipulation mechanism is operative to manipulate the carrier from a raised position on the vehicle nest and elevated through the passage in the support surface to a load position on the load port nest. The lifting mechanism then lowers the carrier onto the load port nest.

In one embodiment, the carrier is transported on the vehicle with a carrier access face oriented at an angle, typically 45°, to the direction of travel on the support structure. The carrier manipulation mechanism is operative to rotate the vehicle and the carrier about a remote center to bring the access face parallel to an access port at the selected destination. Arcuate slots are provided in the load port support surface to allow passage of the pins of the carrier nest.

In another embodiment, the carrier is transported on the vehicle with the carrier access face oriented parallel to the direction of travel. The carrier manipulation mechanism is operative to move the vehicle and carrier to an access port at the selected destination while maintaining the orientation of the carrier access face parallel to the direction of travel along the support structure, which is also parallel to the access port at the selected destination. Arcuate slots are provided in the load port support surface to allow passage of the pins of the carrier nest.

The system is particularly suited for use in semiconductor wafer manufacturing facilities. In the semiconductor field, the carrier nest on the vehicle and the load port nest on the support surface preferably conform to the SEMI E57 standard for semiconductor wafer manufacturing. The tunnel may include a pass through section to allow personnel to pass from one side to another side of the tunnel. An elevator assembly may be provided to lift a vehicle over or under the floor level.

DESCRIPTION OF THE DRAWINGS

The invention will be more fully understood from the following detailed description taken in conjunction with the accompanying drawings in which:

FIG. 9 is a side view of a drawbridge pass through;

FIG. 10 is a top view of a swing bridge pass through;

FIG. 11 is a top view of a turnstile pass through;

DETAILED DESCRIPTION OF THE INVENTION

Figure 1:
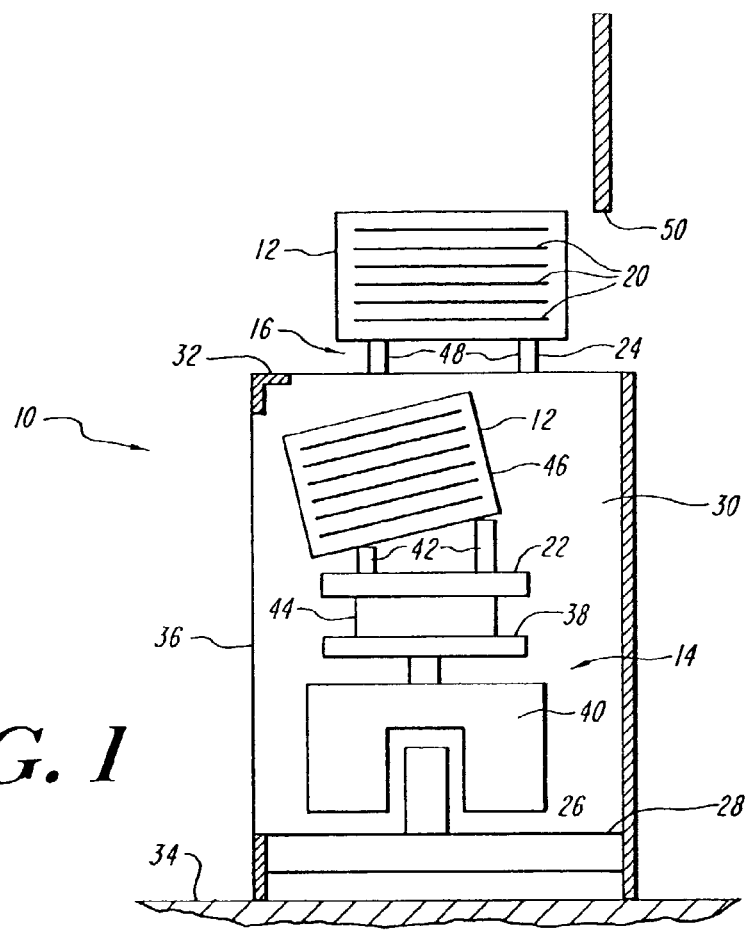
FIG. 1 is a cross-sectional end view of a material handling and transport system according to the present invention.

The material handling and transport system 10 of the present invention is an automated system for handling and transporting material carriers from below. In this system, a material carrier 12 is transported between pieces of process equipment and storage locations by an automated transport vehicle 14. At each destination, the vehicle lifts the carrier onto a load port 16 from where the material in the carrier can be accessed by further processing or storage equipment.

The system is particularly suited for handling semiconductor wafer carriers. Typical semiconductor wafer carriers include cassettes or pods having a front opening sealable by a door as well as cassettes that have an open front with no door. Carriers may also comprise merely a base for supporting the wafers and have no vertical side and top walls. The type of carrier depends on the particular wafer fabrication facility. For example, carriers that have one open side or no sides are typically not transported through contaminated environments. The wafers or other substrates within the carrier are typically oriented horizontally and are accessed by a robotic handler that maintains each substrate in the horizontal or substantially horizontal orientation. The system is able to increase productivity within semiconductor manufacturing facilities by eliminating unnecessary steps in material handling.

In a first embodiment, the system 10 includes a track 26 that runs on a track support 28 in a tunnel 30. The tunnel typically runs in front of and parallel to the process equipment chamber or storage location. In a semiconductor processing facility, the top surface 32 of the tunnel is less 900 mm (35.43 inch) from the floor 34, which is the elevation of the load ports. The tunnel 30 may be maintained at a higher pressure than the outside environment to prevent particles and other contaminants from entering the tunnel. The tunnel is supplied with air filtered to the required cleanliness level. The front vertical surface 36 of the tunnel has removable panels for access to maintain the equipment.

The track 26 is typically rectangular in cross section and may be made of any suitable material, such as steel or another metal, concrete, or a suitable plastic or composite material. The track support 28 may be any suitable foundational structure as required to support the expected loading from the track and the transport vehicles. The track support 28 is illustrated in FIG. 1 as a member extending transverse to the track 26, but could have any suitable configuration.

The transport vehicle 14 runs along the track 26. The vehicle includes a chassis 38 and at least one runner or truck 40. The truck fits over the top and sides of the track 26 and is generally shaped to conform to the track sufficiently that it can ride on the track. Thus, although the track is illustrated as having a rectangular cross-section, other track cross-sections could be used, and the trucks would have suitably conforming configurations. Preferably, two trucks 40 are provided for each chassis 38. The vehicles 14 may be powered in any suitable manner, as known in the art. For example, the vehicles may draw power inductively from the track, or the vehicles may be battery powered. Similarly, the vehicle may receive instructions via cabling running within or adjacent the track or via signals in the electromagnetic spectrum. The vehicles may include on-board sensors and local control, as known in the art The vehicle chassis 14 includes a vehicle nest 22 for loading and unloading the carrier 12 at its destination. The nest 22 includes primary coupling pins or vehicle nest pins 42, preferably in the configuration of the primary kinematic coupling pins specified by the SEMI E57 standard for a semiconductor wafer carrier system. The carrier includes on its bottom surface pin receiving apertures located to receive the pins of the vehicle nest. In this manner, when the carrier is located on the vehicle nest, it is fixed in place by virtue of its placement over the pins. The vehicle also includes a carrier lifting assembly 44, discussed further below.

As an added safety feature for a substrate carrier having one open side 46, the vehicle nest pins 42 may be oriented such that the carrier is held at an angle with the open side tilted upwardly to prevent the substrates inside the carrier from accidentally falling out of the carrier during transport. A suitable incline is 5°, although it will be appreciated that other angles of incline would also work. This incline is illustrated in FIG. 1 at an exaggerated angle for clarity.

On the top surface 32 of the tunnel 30, a load port nest with secondary coupling or load port pins 48 are provided in front of the opening 50 for a processing station or storage location. For a semiconductor wafer carrier handling and transport system, the load port pins 48 preferably conform to the SEMI E57 standard. The load port pins 48 are located in front of the opening 50 of the processing station or storage location, so that, when the carrier 12 is loaded on the pins 48, the substrates in the carrier are accessible by a robot (not shown) through the opening 50. The load port pins are rigidly mounted to the top surface of the tunnel and preferably include sensors for detection of the presence or absence of a carrier, as is known in the semiconductor field. This information may by conveyed to system software for proper use by the system, also as known, for example, in the semiconductor field.

Figure 2:
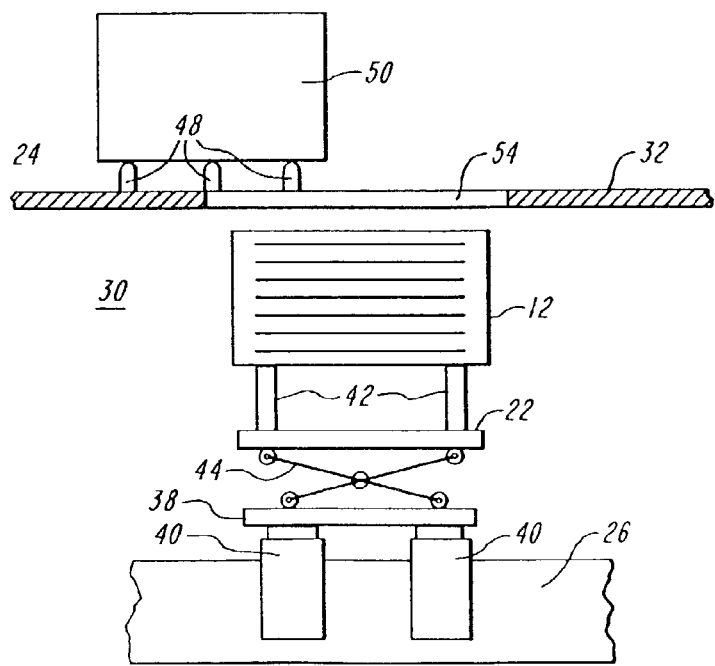
FIG. 2 is a side view of the system of FIG. 1 illustrating a vehicle in a lowered position.
Figure 3:
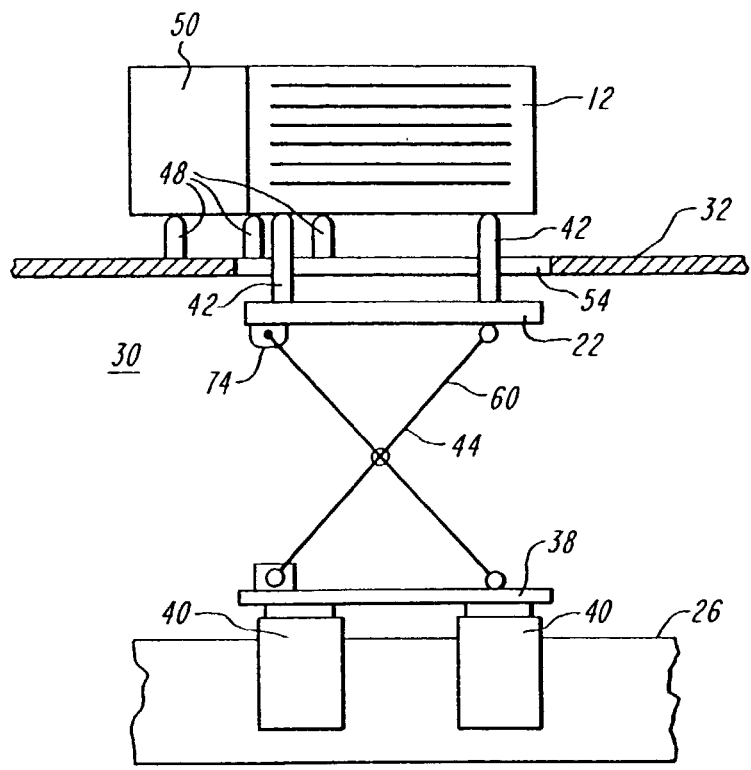
FIG. 3 is a side view of the system of FIG. 1 illustrating a vehicle in a raised position.

Referring to FIGS. 2 and 3, an opening 54 is provided in the top surface 32 of the tunnel 30 at each load port 16. The opening 54 is offset by a small distance in the direction of travel from the opening 50 of the processing station or storage location. The tunnel opening 54 is sized to allow vertical passage of the carrier 12 therethrough. The opening 54 may be sealed with a suitable closure (not shown) if pressurization of the atmosphere in the tunnel is not sufficient to maintain the desired level of cleanliness in the tunnel. When a vehicle 14 stops at a selected opening 54, the lifting mechanism 44 lifts the carrier 12 through the opening 54 to a position above the top surface 32 of the tunnel 30 and slightly above the load port nest pins 48. The vehicle nest pins 42 are also sufficiently high such that other components of the load port nest 22 remain below the top surface 32 of the tunnel 30, as illustrated schematically in FIGS. 2 and 3.

Figure 4:
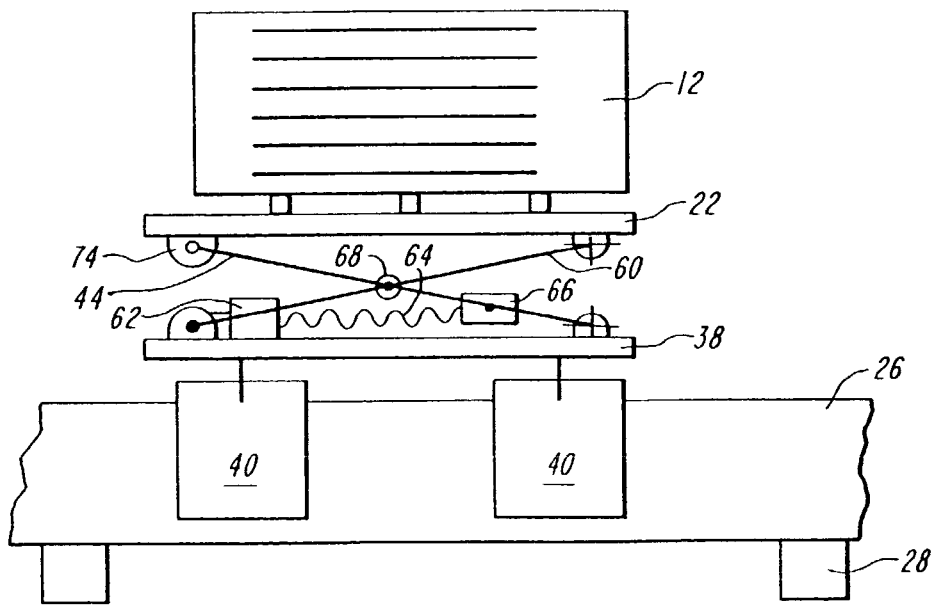
FIG. 4 is a side view of a vehicle of the system of FIG. 1 illustrating a lifting mechanism.

In the presently preferred embodiment, the lifting assembly 44 includes a scissors lift driven by a motor 62 and a lead screw 64 slidably affixed at a bearing 66 to one of a pair of scissor arms 60. The scissor arms are pivotally connected at their midpoints 68 and are connected pivotally and slidably to an upper surface of the chassis 38 and a lower surface of the vehicle nest 22. See FIG. 4. It will be appreciated that many other lifting mechanisms are known in the art and would be suitable for the present invention.

Figure 5:
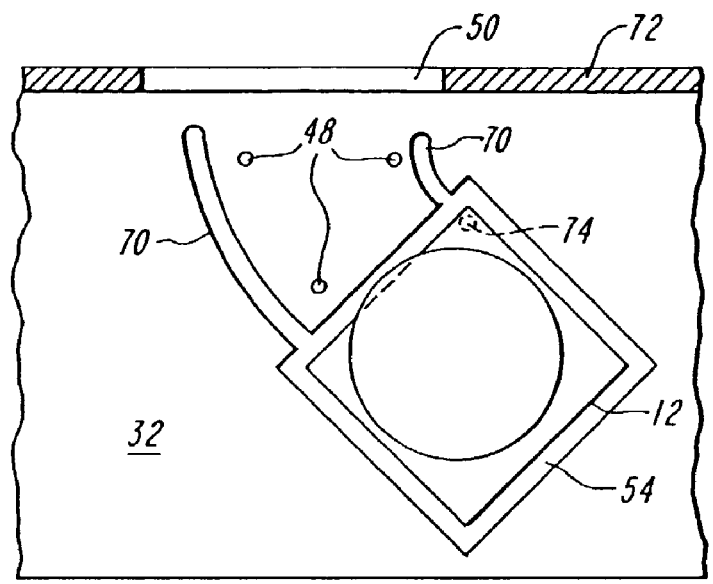
FIG. 5 is a top view of the system of FIG. 1 illustrating an embodiment of a carrier manipulation mechanism with a carrier in a raised position aligned with an opening in a top surface.
Figure 6:
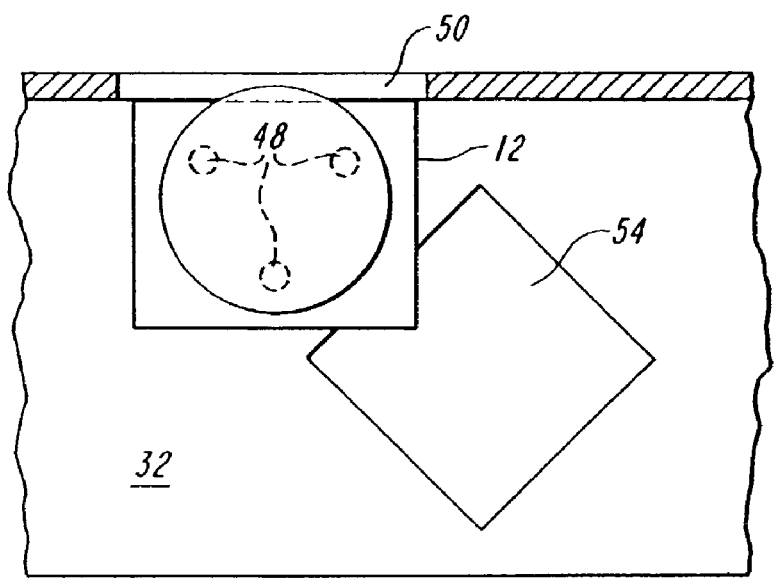
FIG. 6 is a top view of the manipulation mechanism of FIG. 5 with the carrier positioned on a load port.

After the carrier 12 is lifted through the opening 54, it is manipulated into position in front of the opening 50 so that it can be received on the load port pins 48. A first embodiment for manipulating the carrier onto the load port pins is illustrated in FIGS. 5 and 6. The carrier is transported on the vehicle with its access face at an angle, typically 45°, to the direction of travel along the track. As best seen in FIG. 5, two arcuate slots 70 extend from the carrier opening 54 in the top surface toward the opening 50. The load port pins 48, three in this embodiment, are provided in the area between these slots. The vehicle nest is then rotated 45° about a remote center 72. This rotation brings the access face of the carrier in line with the opening, which is parallel to the direction of travel of the vehicle. As the vehicle nest is rotated, the vehicle nest pins 42 sweep an arc and pass through the slots 70 in the top surface 32 of the tunnel. The vehicle nest is rotated by an actuator 74 attached to the lifting mechanism. The actuator 74 may be driven in any suitable manner, such as by a motor (not shown).

Once the carrier 12 is in position in front of the opening 50, the lifting assembly 44 is lowered and the carrier 12 is deposited onto the load port pins 48. The load port pins are provided at the same elevation so that the carrier is in a horizontal attitude. The substrates in the carrier are then accessible by a robot through the opening 50.

To remove a carrier 12 from the load port, the lifting assembly 44 is positioned below the carrier 12 and raises the carrier off of the load port pins 48, supporting the carrier at the desired incline. The vehicle nest 22 then rotates 45° to allow the carrier to be lowered through the opening in the top wall of the tunnel.

Figure 7:
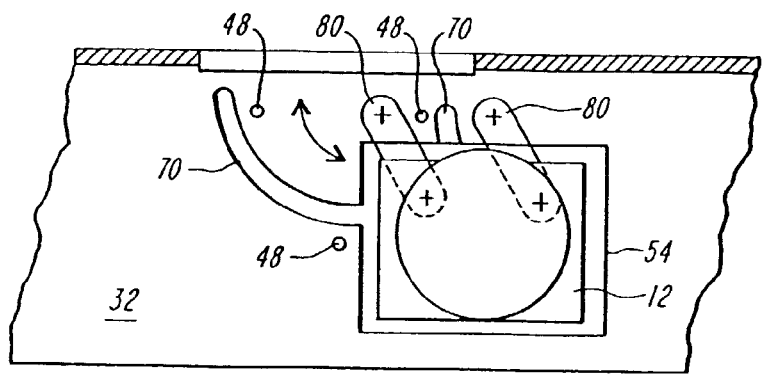
FIG. 7 is a top view of the system of FIG. 1 illustrating a further embodiment of a carrier manipulation mechanism with a carrier in a raised position.
Figure 8:
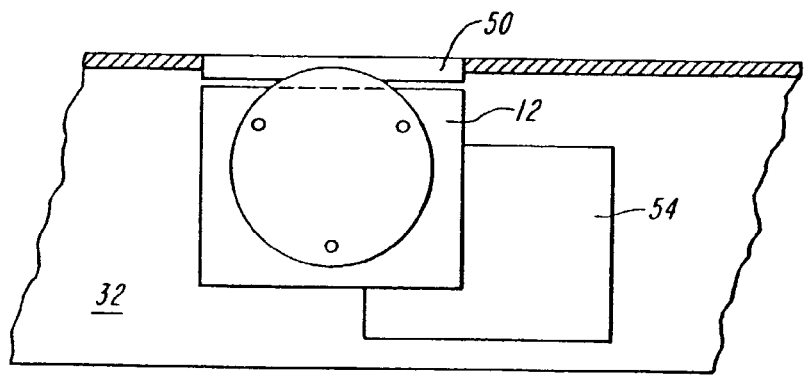
FIG. 8 is a top view of the manipulation mechanism of FIG. 7 with the carrier positioned on a load port.

In an alternative embodiment, illustrated in FIGS. 7 and 8, the carrier 12 is transported with its access face parallel to the direction of travel of the vehicle 14 along the track 26. The vehicle 14 stops at a location slightly offset from the opening 50. The lifting assembly 44 raises the carrier up through the opening 54 in the top wall 32 of the tunnel 30. The carrier is then moved into position in front of the opening 50 by a linkage 80 engageable with the vehicle nest 22 that maintains the access face of the carrier parallel to the vehicle travel direction. The vehicle nest pins 44 sweep through slots 70 in the top wall 32 of the tunnel 30. When the carrier is in position at the opening 50, the lifting assembly 44 is lowered, depositing the carrier on the load port pins 48. To remove a carrier from a load port 16, the lifting assembly 44 is positioned beneath the carrier and is raised up from beneath the carrier until the nest pins 48 engage the carrier, lifting the carrier at the appropriate incline, for example, 5°, from horizontal. The vehicle nest 22 then swings back over the opening 54 in the top wall 32 of the tunnel 30 and is lowered into the tunnel to transport the carrier to its next destination.

Figure 9:
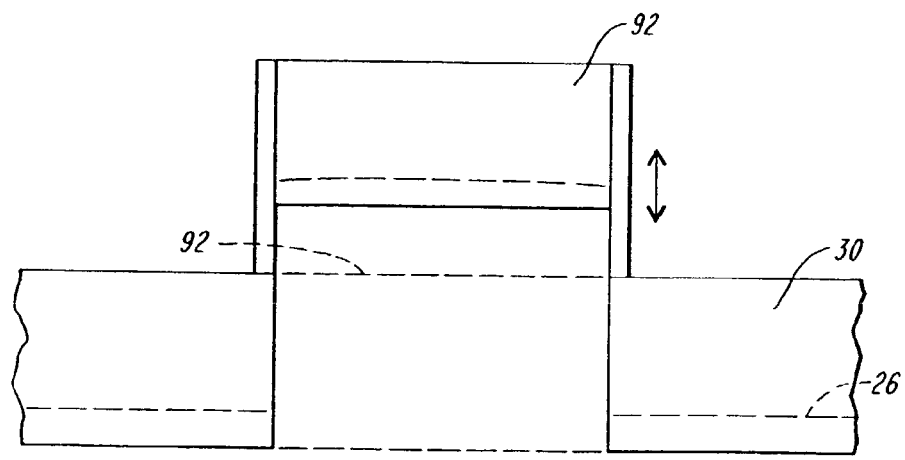
Figure 10:
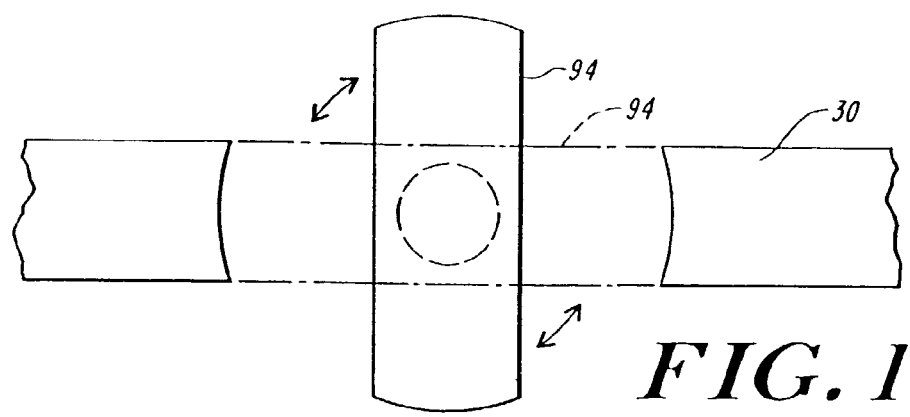
Figure 11:
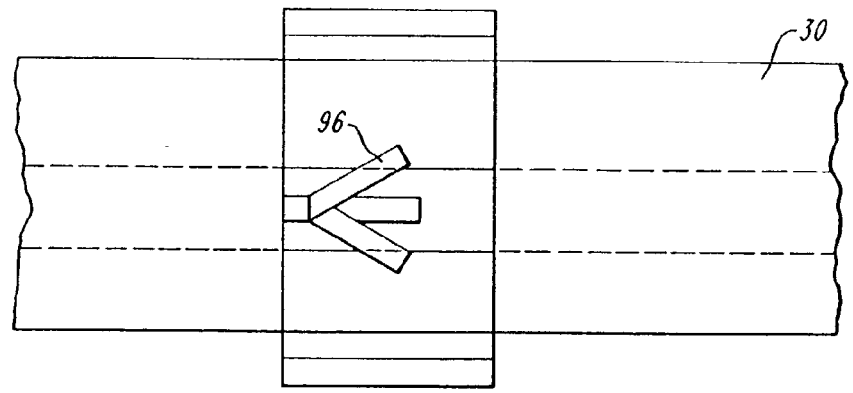
Figure 12:
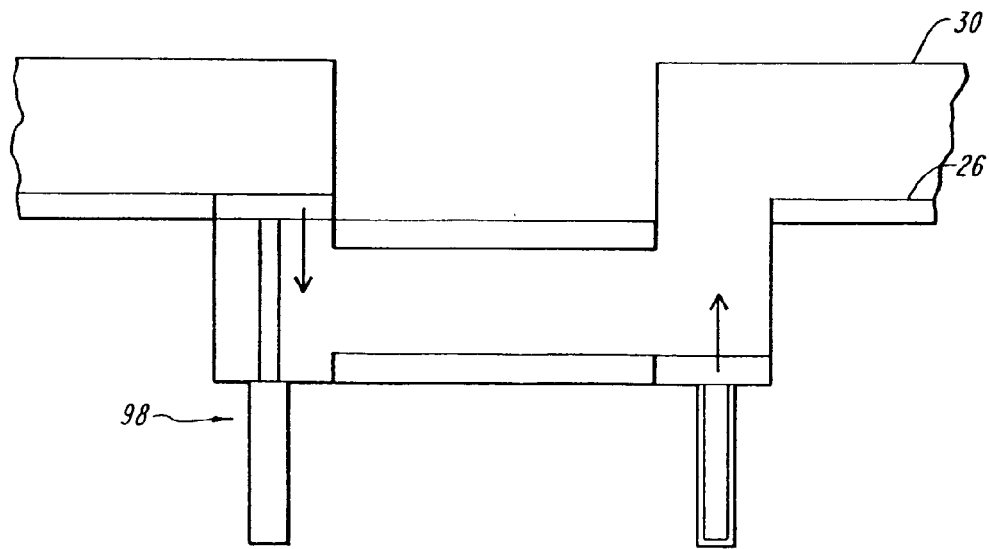
FIG. 12 is a side view of an elevator assembly.

The material handling and transport system may be used as an intra-bay or inter-bay transport system in semiconductor manufacturing. As an intra-bay system, the track passes in front of bay openings. A pass through, such as a drawbridge 92 (FIG. 9), swing track 94 (FIG. 10), or turnstile 96 (FIG. 11), is provided in the track to allow personnel to enter a bay. Alternatively, to leave the bay opening clear at all times, an elevator assembly 98 (FIG. 12) may be provided on either side of the bay opening to transport a vehicle over or under the opening. Because the track runs close to the floor, an elevator system that lowers vehicles to allow them to pass beneath the floor is most economical.

Figure 13:
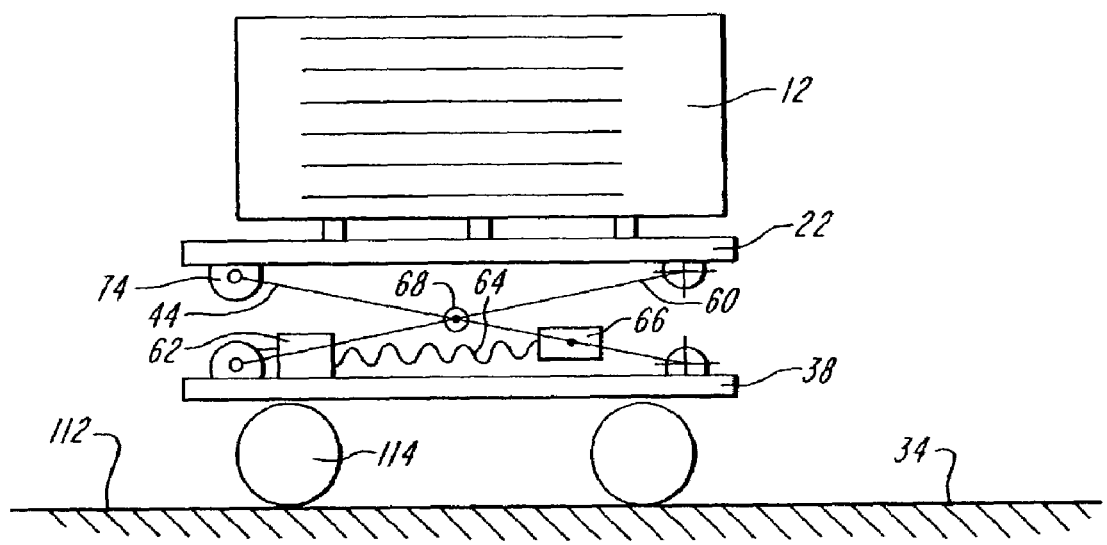
FIG. 13 is a side view of a further embodiment of a material handling and transport system traveling on a pathway.

It will be appreciated that other variations and modifications are contemplated within the scope of the present invention. For example, although described in conjunction with a single track or monorail system, various embodiments of the present material handling and transport system may be implemented on a two-track assembly. Alternatively, a track system is not always necessary, and the system may be implemented on a pathway 112 defined on the floor 34 along which the vehicle travels (FIG. 13). In this case, the vehicle may be provided, for example, with wheels 114. It will also be appreciated that in certain environments the tunnel walls may be omitted. The invention is not to be limited by what has been particularly shown and described, except as indicated by the appended claims.

What is claimed is:

1. A process for transporting a carrier between storage and processing destinations and for handling the carrier at the destinations, comprising:

transporting the carrier along a support structure on a vehicle;

stopping the carrier adjacent a selected destination;

lifting the carrier from below, with a lifting mechanism disposed below the carrier to contact a lower surface of the carrier beneath an interior product receiving space of the carrier, to a raised position at the selected destination;

manipulating the carrier, while supported from beneath the interior product receiving space, over a load port nest with an access face of the carrier oriented for access by a processing tool or storage device; and lowering the carrier, while supported from beneath the interior product receiving space, onto the load port nest.

2. The process of claim 1, wherein:

the carrier is transported on the vehicle with the carrier access face oriented at an angle to the direction of travel; and the manipulating step further comprises rotating the vehicle and the carrier about a remote center to bring the access face parallel to an access port at the selected destination.

3. The process of claim 2 wherein the angle is 45°.

4. The process of claim 1, wherein:

the carrier is transported on the vehicle with the carrier access face oriented parallel to the direction of travel; and the manipulating step further comprises moving the vehicle and the carrier to an access port at the selected destination while maintaining the orientation of the carrier access face parallel to the direction of travel on the support structure.

5. The process of claim 1, wherein the carrier is transported along the support structure at an incline configured to prevent substrate material in the carrier from falling out of an opening in the carrier.

6. The process of claim 5, wherein the incline is 5° from horizontal.

7. The process of claim 1, wherein in the transporting step, the carrier is transported through a tunnel.

8. The process of claim 7, wherein the carrier is lifted through an opening in a top surface of the tunnel.

9. The process of claim 1, wherein in the transporting step, the support structure comprises a track.

10. The process of claim 1, wherein in the transporting step, the support structure comprises a floor.

* * * * *